United States Patent
Jeon et al.

(10) Patent No.: US 9,368,560 B2
(45) Date of Patent: Jun. 14, 2016

(54) ORGANIC LIGHT EMITTING DISPLAY DEVICES AND METHODS OF FABRICATING THE SAME

(71) Applicant: Samsung Display Co., Ltd., Yongin, Gyeonggi-do (KR)

(72) Inventors: Woosik Jeon, Hwaseong-si (KR); Young-Mo Koo, Suwon-si (KR); Min Woo Lee, Suwon-si (KR); Jaegoo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 99 days.

(21) Appl. No.: 13/964,021

(22) Filed: Aug. 9, 2013

(65) Prior Publication Data
US 2014/0167000 A1  Jun. 19, 2014

(30) Foreign Application Priority Data
Dec. 18, 2012  (KR) .................. 10-2012-0148775

(51) Int. Cl.
H01L 27/32  (2006.01)
H01L 51/52  (2006.01)

(52) U.S. Cl.
CPC ........ *H01L 27/3248* (2013.01); *H01L 51/5206* (2013.01)

(58) Field of Classification Search
CPC .................................. H01L 27/3248
USPC .......................................................... 257/40
See application file for complete search history.

(56) References Cited

U.S. PATENT DOCUMENTS

| | | | |
|---|---|---|---|
| 2007/0131914 A1* | 6/2007 | Elschner et al. | 252/500 |
| 2007/0281136 A1* | 12/2007 | Hampden-Smith | B41M 1/22 428/195.1 |
| 2011/0140113 A1* | 6/2011 | Park | 257/59 |
| 2012/0007057 A1 | 1/2012 | Choi et al. | |
| 2012/0080664 A1* | 4/2012 | Kim et al. | 257/40 |
| 2013/0069067 A1* | 3/2013 | Youn | H01L 27/3279 257/59 |

FOREIGN PATENT DOCUMENTS

| | | |
|---|---|---|
| KR | 10-0824881 B1 | 4/2008 |
| KR | 10-2011-0102371 A | 9/2011 |
| KR | 10-2012-0004783 A | 1/2012 |
| WO | WO 2010/061315 A1 | 6/2010 |

* cited by examiner

*Primary Examiner* — Ha Tran T Nguyen
*Assistant Examiner* — Aaron Dehne
(74) *Attorney, Agent, or Firm* — Lewis Roca Rothgerber Christie LLP

(57) ABSTRACT

An organic light emitting display device includes a thin film transistor on a substrate, a first protection layer covering the thin film transistor, a conductive organic layer on the first protection layer and coupled to the thin film transistor, and an organic light emitting device on the conductive organic layer and coupled to the conductive organic layer.

17 Claims, 14 Drawing Sheets

ORGANIC LIGHT EMITTING DISPLAY DEVICES AND METHODS OF FABRICATING THE SAME

CROSS-REFERENCE TO RELATED APPLICATIONS

This U.S. non-provisional patent application claims priority under 35 U.S.C. §119 to and the benefit of Korean Patent Application No. 10-2012-0148775, filed on Dec. 18, 2012, in the Korean Intellectual Property Office, the entire contents of which are hereby incorporated by reference.

BACKGROUND

Embodiments of the present inventive concepts relate to an organic light emitting display device and a method of fabricating the same.

Conventionally, an organic light emitting display device may include an organic layer provided on an anode and a cathode provided on the organic layer. The anode may be partially exposed by a pixel-defining layer. The organic light emitting display device may be configured to inject holes and electrons to the organic layer from the anode and the cathode, respectively. Holes and electrons injected into the organic layer are recombined with each other to generate excitons. Light may be emitted when the excitons transition from the excited state to the ground state.

The organic light emitting display device may include a substrate provided with a thin film transistor and an organic light emitting device having a pixel electrode that is electrically connected to a drain electrode of the thin film transistor. Conventionally, the drain electrode and the pixel electrode may be electrically connected to each other through a contact hole. A contact area between the drain and pixel electrodes may be much smaller than a size of the contact hole, and thus, a contact failure may occur between the drain and pixel electrodes.

SUMMARY

Example embodiments of the present inventive concepts provide an organic light emitting display device, in which interconnection lines are coupled to each other with an improved electric connection property.

Other example embodiments of the present inventive concepts provide a method of fabricating the organic light emitting display device.

According to example embodiments of the present inventive concepts, an organic light emitting display device includes a thin film transistor on a substrate, a first protection layer covering the thin film transistor, a conductive organic layer on the first protection layer and coupled to the thin film transistor, and an organic light emitting device on the conductive organic layer and coupled to the conductive organic layer.

In example embodiments, the conductive organic layer may include at least one of polyethylene-based polymer doped with conductive impurities, polypyrrole-based polymer doped with conductive impurities, or polythiophene-based polymer doped with conductive impurities, each of which contains one substituent of —COOH, —SH, —NH$_2$, —NH, or —N.

In example embodiments, the organic light emitting display device may include a first electrode coupled to the conductive organic layer, an organic layer on the first electrode and including at least an emitting layer, and a second electrode on the organic layer.

In example embodiments, the device may further include a second protection layer between the conductive organic layer and the organic light emitting device. The second protection layer may have a via hole exposing a portion of the conductive organic layer, and the first electrode may be coupled to the conductive organic layer through the via hole.

According to example embodiments of the present inventive concepts, an organic light emitting display device includes a thin film transistor on a substrate, a protection layer covering the thin film transistor, and an organic light emitting device on the protection layer and coupled to the thin film transistor. The organic light emitting device may include a first electrode on the protection layer and including a conductive organic material, an organic layer on the first electrode, and a second electrode on the organic layer.

According to example embodiments of the present inventive concepts, a method of fabricating an organic light emitting display device includes forming a thin film transistor on a substrate, forming a first protection layer to cover the thin film transistor, the first protection layer having a contact hole exposing a portion of a drain electrode of the thin film transistor, forming a conductive organic layer on the first protection layer, the conductive organic layer being coupled to the drain electrode, and forming an organic light emitting device coupled to the conductive organic layer.

In example embodiments, the method may further include irradiating the conductive organic layer with light. The light irradiation of the conductive organic layer may cause a radical reaction to occur in the conductive organic layer.

In example embodiments, the conductive organic layer may be irradiated with the light while supplying at least one initiator of oxygen ($O_2$), ozone ($O_3$), nitrogen dioxide ($NO_2$), hydrogen peroxide ($H_2O_2$), ammonia ($NH_3$), or hydrazine ($N_2H_4$) onto the conductive organic layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
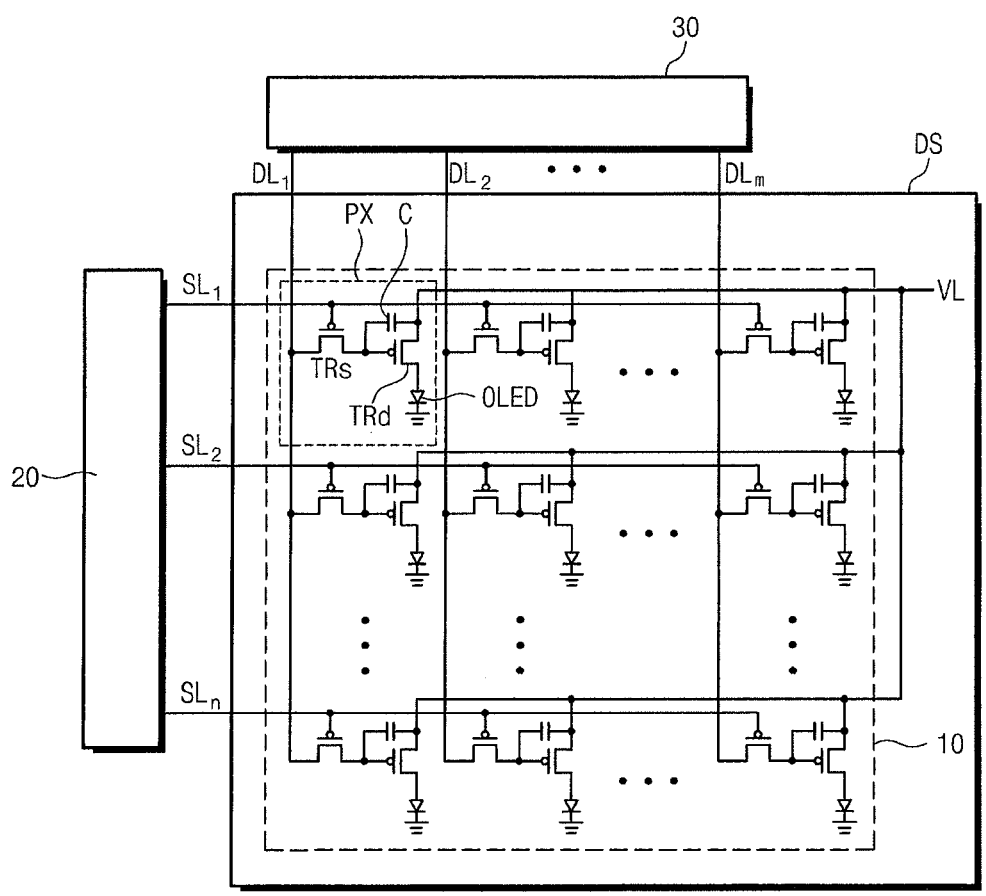
FIG. 1 is a schematic circuit diagram of an organic light emitting display device according to example embodiments of the present inventive concepts.

It should be noted that these figures are intended to illustrate the general characteristics of methods, structure and/or materials utilized in certain example embodiments and to supplement the written description provided below. These drawings are not, however, necessarily to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the present inventive concepts will now be described more fully with reference to the accompanying drawings, in which example embodiments are shown. Example embodiments of the present inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. When an element is referred to as being "directly connected" or "directly coupled" to another element, there may be no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic circuit diagram of an organic light emitting display device according to example embodiments of the inventive concept.

Referring to FIG. 1, an organic light emitting display device may include a display substrate DS with a display portion 10 configured to display an image, a scan driver 20, and a data driver 30.

The scan driver 20 and the data driver 30 may be electrically coupled (e.g., electrically connected) to the display portion 10 through signal lines, respectively. In example embodiments, the signal lines may include scan lines $SL_1$, $SL_2$, and $SL_n$, data lines $DL_1$, $DL_2$, and $DL_m$, and power supply lines VL, at least one of which is disposed (e.g., arranged) to cross the others.

For example, the scan driver 20 may be electrically coupled to the display portion 10 through a plurality of the scan lines $SL_1$, $SL_2$, and $SL_n$. The scan driver 20 may be configured to send scan signals to the display portion 10 through the scan lines $SL_1$, $SL_2$, and $SL_n$, which may be provided on the display substrate DS to extend in a specific direction (e.g., a first direction).

The data driver 30 may be electrically coupled to the data lines $DL_1$, $DL_2$, and $DL_m$. Accordingly, the data driver 30 may be electrically coupled to the display portion 10 through a plurality of the data lines $DL_1$, $DL_2$, and $DL_m$. The data driver 30 may be configured to send data signals to the display portion 10 through the data lines $DL_1$, $DL_2$, and $DL_m$.

The data lines $DL_1$, $DL_2$, and $DL_m$ may extend along a different direction (e.g., a second direction) from the scan lines $SL_1$, $SL_2$, and $SL_n$. In other words, the data lines $DL_1$, $DL_2$, and $DL_m$ may cross the scan lines $SL_1$, $SL_2$, and $SL_n$.

The power supply lines VL may apply an electric power to the display portion 10. The power supply lines VL may be disposed (or arranged) to cross the data lines $DL_1$, $DL_2$, and $DL_m$ and/or the scan lines $SL_1$, $SL_2$, and $SL_n$.

The display portion 10 may include a plurality of pixels PX. Each of the pixels PX may be electrically coupled to the corresponding one of the data lines $DL_1$, $DL_2$, and $DL_m$, the corresponding one of the scan lines $SL_1$, $SL_2$, and $SL_n$, and the corresponding one of the power supply lines VL. Each of the pixels PX may include a switching thin film transistor TRs, a driving thin film transistor TRd, a capacitor C, and an organic light emitting device OLED.

The switching thin film transistor TRs and the driving thin film transistor TRd may be coupled to the corresponding one of the scan lines $SL_1$, $SL_2$, and $SL_n$, and the corresponding one of the data lines $DL_1$, $DL_2$, and $DL_m$. Each of the switching and driving thin film transistors TRs and TRd may include a semiconductor active layer, a gate electrode electrically separated (e.g., electrically isolated) from the semiconductor active layer, and source and drain electrodes connected (electrically and/or physically coupled or connected) to the semiconductor active layer.

As for operations of the organic electroluminescence display device, the scan signal from the scan driver 20 and the data signal from the data driver 30 may be transmitted to each of the pixels PX through the scan lines $SL_1$, $SL_2$, and $SL_n$ and the data lines $DL_1$, $DL_2$, and $DL_m$, respectively. In each of the pixels PX, the switching thin film transistor TRs may be configured to control a switching operation of the driving thin film transistor TRd in response to the scan signal and the data signal applied thereto. The driving thin film transistor TRd may be configured to supply a driving electric current, which corresponds to the data signal, to the organic light emitting device OLED. The supplied driving electric current may be used to generate light in the organic light emitting device OLED.

In example embodiments, to preserve the data signal during a specific duration (e.g., a predetermined duration), a capacitor C may be provided between the drain electrode of the switching thin film transistor TRs and the gate electrode of the driving thin film transistor TRd. Due to the presence of the capacitor C, the data signal can be applied to the gate electrode of the driving thin film transistor TRd during the specific duration, even when the switching thin film transistor TRs is in an off state.

Although not shown in detail, the organic electro luminescence display device may further include at least one thin film transistor and at least one capacitor to improve threshold voltage characteristics of the driving thin film transistor.

Hereinafter, structures of the organic light emitting display device will be described in detail with reference to FIGS. 2 and 3. Further, for the sake of brevity, an upper direction will refer to the direction from the base substrate to the switching thin film transistor TRs, the driving thin film transistor TRd, or the organic light emitting device OLED.

Figure 2:
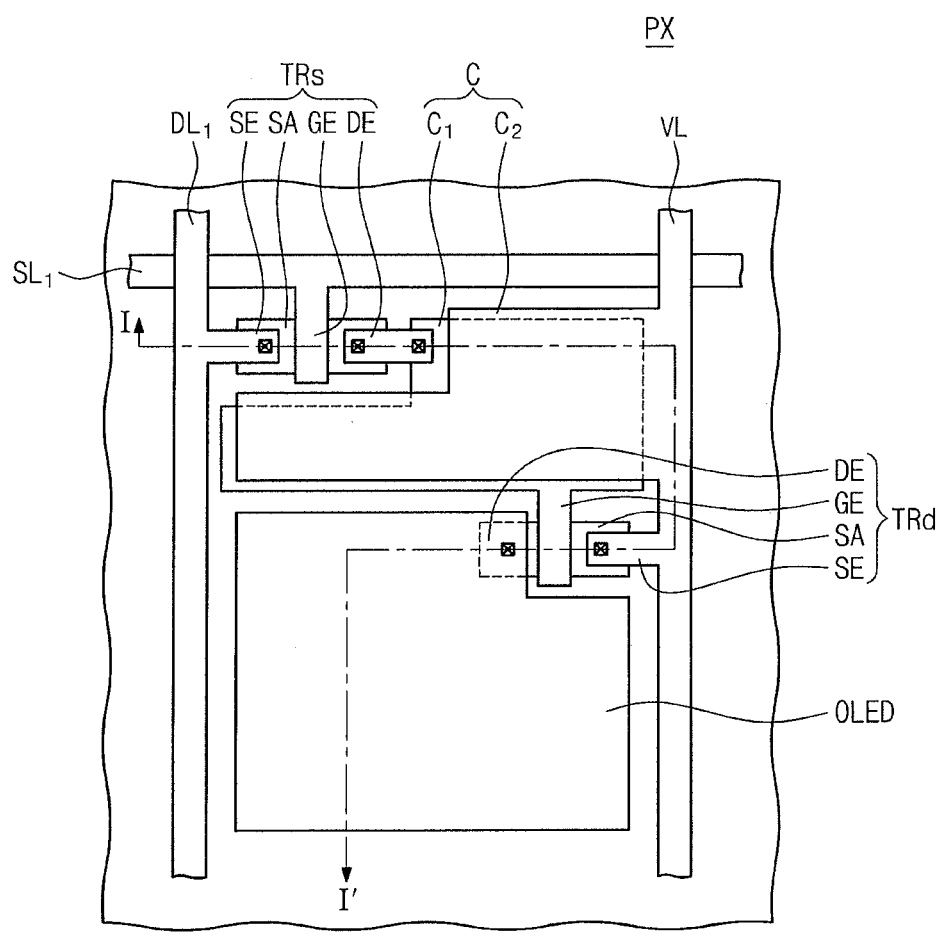
FIG. 2 is a plan view exemplarily illustrating one of pixels provided in the device of FIG. 1.
Figure 3:
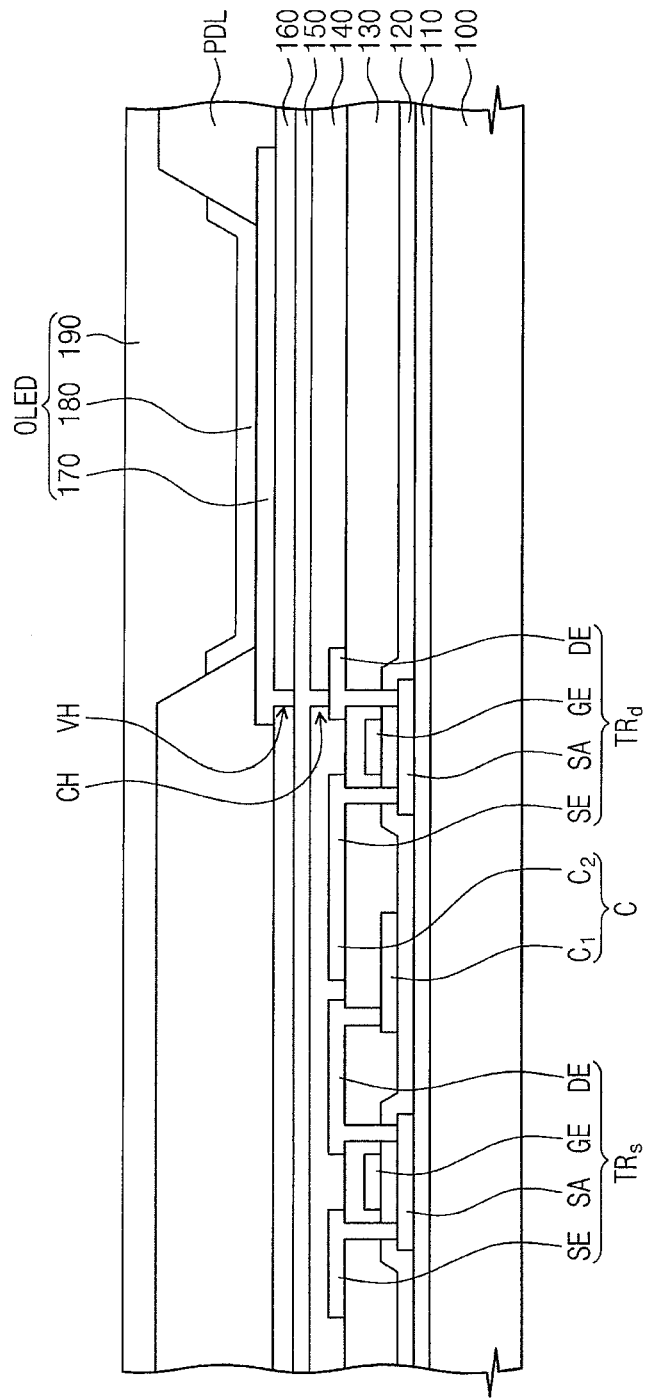
FIG. 3 is a sectional view taken along the line I-I' of FIG. 2.

FIG. 2 is a plan view exemplarily illustrating one of pixels provided in the device of FIG. 1, and FIG. 3 is a sectional view taken along the line I-I' of FIG. 2.

Referring to FIGS. 2 and 3, each pixel PX of the organic light emitting display device may be electrically coupled (e.g., electrically connected) to the corresponding one of the data lines $DL_1$, $DL_2$, and DLm, the corresponding one of the scan lines $SL_1$, $SL_2$, and SLn, and the corresponding one of the power supply lines VL. Further, each pixel PX may include the switching thin film transistor TRs, the driving thin film transistor TRd, the capacitor C electrically coupled (e.g., electrically connected) to the switching and driving thin film transistors TRs and TRd, and the organic light emitting device OLED.

Hereinafter, for the sake of brevity, the following description will be given based on one of the pixels PX that is coupled to the first scan line $SL_1$ and the first data line $DL_1$.

The switching thin film transistor TRs and the driving thin film transistor TRd may be coupled to the first scan line $SL_1$ and the first data line $DL_1$. The switching and driving thin film transistors TRs and TRd may include a semiconductor active layer SA, a gate electrode GE electrically and/or physically separated (or isolated) from the semiconductor active layer SA, and a source electrode SE and a drain electrode DE that are electrically and/or physically coupled (e.g., electrically connected) to the semiconductor active layer SA.

In example embodiments, the switching and driving thin film transistors TRs and TRd may include the semiconductor active layer SA provided on an optically transparent base substrate 100 (e.g., made of glass or transparent plastic material), the gate electrode GE electrically separated (electrically and/or physically isolated) from the semiconductor active layer SA, and the source electrode SE and the drain electrode DE that are electrically and/or physically coupled or connected to the semiconductor active layer SA.

The semiconductor active layer SA may include at least one of amorphous silicon (a-Si), poly silicon (p-Si), or an oxide semiconductor. Further, the semiconductor active layer SA may include source and drain regions, which are electrically and/or physically coupled or connected to the source and drain electrodes SE and DE, respectively, and are doped with impurities, and a channel region provided between the source and drain regions. Here, the oxide semiconductor may include at least one of Zn, In, Ga, Sn, or mixtures thereof. For example, the oxide semiconductor may include indium-gallium-zinc oxide (IGZO).

Although not shown, in the case where the semiconductor active layer SA includes a layer made of oxide semiconductor, a light blocking layer may be provided on and/or below the semiconductor active layer SA to prevent external light from being incident on the semiconductor active layer SA.

A buffer layer 110 may be provided between the semiconductor active layer SA and the base substrate 100. The buffer layer 110 may be one of a silicon oxide layer and a silicon nitride layer, or be provided to have a multilayered structure including a silicon oxide layer and a silicon nitride layer. The buffer layer 110 may prevent impurities, e.g., water and oxygen, from being diffused or infiltrated into the switching thin film transistor TRs, the driving thin film transistor TRd and the organic light emitting device OLED. In addition, the buffer layer 110 may be provided to realize a planarized surface.

A gate insulating layer 120 may be provided on the semiconductor active layer SA and the base substrate 100 to cover the semiconductor active layer SA and electrically separate (or electrically isolate) the semiconductor active layer SA from the gate electrode GE. The gate insulating layer 120 may include at least one of silicon oxide ($SiO_2$) or silicon nitride (SiNx).

The first scan line $SL_1$ and a first capacitor electrode $C_1$ may be provided on the gate insulating layer 120 to extend along a specific direction (e.g., a predetermined direction). A portion of the first scan line $SL_1$ provided in the pixel PX may be overlapped with the channel region of the semiconductor active layer SA, thereby serving as the gate electrode GE.

An interlayer insulating layer 130 may be provided on the gate insulating layer 120 and the gate electrode GE. Similar to the gate insulating layer 120, the interlayer insulating layer 130 may include at least one of silicon oxide or silicon nitride. The interlayer insulating layer 130 may be formed to expose partially the source and drain regions of the semiconductor active layer SA.

The first data line $DL_1$, the power supply line VL, the source electrode SE and the drain electrode DE may be provided on the interlayer insulating layer 130 to cross the first scan line $SL_1$. They may be electrically separated (or electrically isolated) from the first scan line $SL_1$. At least one of the source electrode SE, the drain electrode DE, the second capacitor electrode $C_2$, the first data line $DL_1$ or the power supply line VL may include a reflective material. For example, the source electrode SE, the drain electrode DE, the second capacitor electrode $C_2$, the first data line $DL_1$ and the power supply line VL may include at least one layer made of Al or Al-alloy.

The source electrode SE and the drain electrode DE may be electrically separated (e.g., electrically isolated) from the gate electrode GE by the interlayer insulating layer and be coupled (e.g., connected) to the source region and the drain region.

In the present embodiment, all of the driving thin film transistor TRd and the switching thin film transistor TRs have been described to have a top gate structure, but example embodiments of the present inventive concepts may not be limited thereto. For example, at least one of the driving thin film transistor TRd or the switching thin film transistor TRs may be configured to have a bottom gate structure.

The capacitor C may include the first capacitor electrode $C_1$ and the second capacitor electrode $C_2$. The first capacitor electrode $C_1$ may be formed of the same material and at the same level as the first scan line $SL_1$ and the gate electrode GE. For example, the first capacitor electrode $C_1$ may be provided on the gate insulating layer 120. The second capacitor electrode $C_2$ may be formed of the same material and at the same level as the first data line $DL_1$, the power supply line VL, the source electrode SE, and the drain electrode DE.

A first protection layer 140 may be disposed (e.g., located, arranged, or formed) on the base substrate 100 provided with the switching thin film transistor TRs, the driving thin film transistor TRd, and the capacitor C. In example embodiments, the first protection layer 140 may cover the switching thin film transistor TRs, the driving thin film transistor TRd and the capacitor C. In addition, the first protection layer 140 may have a contact hole CH exposing a portion of the drain electrode DE.

The first protection layer 140 may include at least one of silicon oxide or silicon nitride.

A conductive organic layer 150 may be provided on the first protection layer 140 and be connected (e.g., electrically and/or physically coupled or connected) to the drain electrode DE through the contact hole CH. Further, the conductive organic layer 150 may be optically transparent. The conductive organic layer 150 may include at least one of polyethylene-based polymer doped with conductive impurities, polypyrrole-based polymer doped with conductive impurities, or polythiophene-based polymer doped with conductive impurities, each of which contains one substituent of —COOH, —SH, —NH$_2$, —NH, or —N. In the case where one of infrared light, ultraviolet light and radioactive ray is incident on the conductive organic layer 150 from the outside, due to the presence of the substituent, a radical reaction may occur in the conductive organic layer 150. In example embodiments, the radical reaction may contribute to improve electric contacting characteristics between the conductive organic layer 150 and the drain electrode DE.

A second protection layer 160 may be provided on the conductive organic layer 150. The second protection layer 160 may include a via hole VH exposing a portion of the conductive organic layer 150. In example embodiments, the via hole VH may be overlapped with the contact hole CH of the first protection layer 140.

The second protection layer 160 may include at least one layer. For example, the second protection layer 160 may include an inorganic protection layer and an organic protection layer disposed (e.g., located, arranged, or formed) on the inorganic protection layer. The inorganic protection layer may include at least one of silicon oxide or silicon nitride. Further, the organic protection layer may include at least one of acryl, polyimide (PI), polyamide (PA) or benzocyclobutene (BCB). In example embodiments, the organic protection layer may be transparent and flexible, and thus, it may serve as a planarization layer reducing unevenness of an underlying structure.

The organic light emitting device OLED may be provided on the second protection layer 160. The organic light emitting device OLED may include a first electrode 170 coupled to the conductive organic layer 150, an organic layer 180 disposed (e.g., located, arranged, or formed) on the first electrode 170, and a second electrode 190 disposed (e.g., located, arranged, or formed) on the organic layer 180.

At least one of the first electrode 170 or the second electrode 190 may be a transmissive electrode. For example, in the case where the organic light emitting display device is a bottom-emission type display device, the first electrode 170 may be a transmissive electrode, while the second electrode 190 may be a reflective electrode. Alternatively, in the case where the organic light emitting display device is a top-emission type display device, the first electrode 170 may be a reflective electrode, while the second electrode 190 may be a transmissive electrode. In the case where the organic light emitting display device is a dual emission type display device, both of the first electrode 170 and the second electrode 190 may be transmissive electrodes.

One of the first electrode 170 and the second electrode 190 may be an anode electrode, and the other may be a cathode electrode.

For the sake of brevity, an embodiment, in which the first electrode 170 and the second electrode 190 are used as a transparent anode electrode and a reflective cathode electrode, respectively, will be described.

The first electrode 170 may be disposed (e.g., located, arranged, or formed) on the second protection layer 160 and be connected (e.g., electrically and/or physically coupled or connected) to the conductive organic layer 150 through the via hole VH. The first electrode 170 may include a transparent conductive oxide, whose work-function is higher than that of the second electrode 190. For example, the first electrode 170 may include one of Indium tin oxide (ITO), indium zinc oxide (IZO), aluminum Zinc Oxide (AZO), gallium doped zinc oxide (GZO), zinc tin oxide (ZTO), Gallium tin oxide (GTO), and fluorine doped tin oxide (FTO).

The first electrode 170 may be partially exposed by a pixel-defining layer PDL. The pixel-defining layer PDL may include an organic insulating material. For example, the pixel-defining layer PDL may include at least one of polystylene, poly methyl methacrylate (PMMA), polyacrylonitrile (PAN), polyamide, polyimide, polyarylether, heterocyclic polymer, parylene, fluorine series polymer, epoxy resin, benzocyclobutene series resin, siloxane series resin, or silane.

The second electrode 190 may include at least one of materials (e.g., Mo, W, Ag, Mg, Al, Pt, Pd, Au, Ni, Nd, Ir, Cr, Li, Ca and alloys thereof), whose work-function is smaller than the first electrode 170. In addition, a conductive layer (not shown) may be provided on the second electrode 190 to prevent an IR-drop problem of the second electrode 190 from occurring or to reduce such an IR-drop problem.

The organic layer 180 may be disposed (e.g., located, arranged, or formed) over the first electrode 170 exposed by the pixel-defining layer PDL. The organic layer 180 may have a multi-layered structure including at least one emitting layer EML. For example, the organic layer 180 may include a hole injection layer HIL, a hole transport layer HTL, the emitting layer EML, a hole blocking layer HBL, an electron transport layer ETL, and/or an electron injection layer EIL. The hole transport layer HTL may have high hole mobility and be configured to suppress movement of electrons that are not combined in the emitting layer EML, thereby increasing probability of recombination between holes and electrons in the emitting layer EML. In the emitting layer EML, the injected electrons and holes may be combined with each other to emit light. The hole blocking layer HBL may be configured to suppress holes, which are not combined with electrons in the emitting layer EML, from moving. The electron transport layer ETL may be configured to move electrons to the emitting layer EML efficiently. In example embodiments, the emitting layer of the organic layer 180 may be configured to emit one of red, green, blue and white lights, but example embodiments of the present inventive concepts may not be limited thereto. For example, the emitting layer of the organic layer 180 may be configured to emit one of magenta, cyan, and yellow lights.

According to example embodiments of the present inventive concepts, the organic light emitting display device may be configured to include the conductive organic layer 150 that is provided between the drain electrode DE and the first electrode 170 of the driving thin film transistor TRd to prevent contacting failure between the drain electrode DE and the first electrode 170 from occurring, or to reduce the occurrence of such a contacting failure.

Hereinafter, a method of fabricating the organic light emitting display device will be described with reference to FIGS. 4 through 8.

FIGS. 4 through 8 are sectional views illustrating a method of fabricating an organic light emitting display device of FIGS. 1 through 3.

Figure 4:
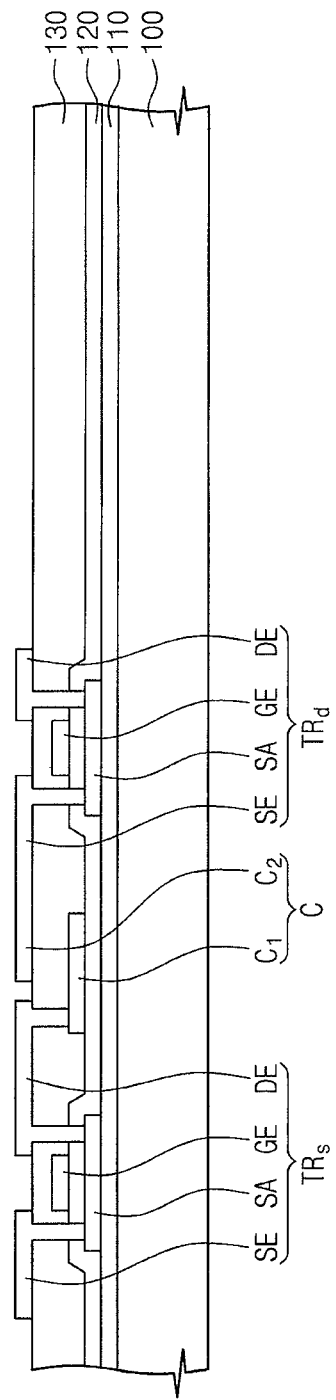
FIGS. 4 through 8 are sectional views illustrating a method of fabricating an organic light emitting display device of FIGS. 1 through 3.

Referring to FIG. 4, a base substrate 100 may be provided. The base substrate 100 may be formed of a transparent insulating material, for example. For example, the insulating substrate 100 may be a rigid-type insulating substrate made of glass or polymer (e.g., transparent plastic). For a plastic substrate, the insulating substrate 100 may be formed of polyethylene terephthalate (PET), plastic fiber reinforced plastic, or polyethylene naphthalate (PEN). Further, the base substrate 100 may be a transparent flexible substrate made of an insulating material.

A buffer layer 110 may be formed on the base substrate 100. The buffer layer 110 may be formed of a silicon oxide layer or a silicon nitride layer, or be provided to have a multilayered structure including a silicon oxide layer and a silicon nitride layer. The buffer layer 110 may prevent impurities provided in the base substrate 100 from being diffused. Further, the buffer layer 110 may prevent water and oxygen from being infiltrated from the outside into the device. In addition, the buffer layer 110 may be provided to realize a planarized or flat surface.

After the formation of the buffer layer 110, a switching thin film transistor TRs, a capacitor C, and a driving thin film transistor TRd may be formed on the buffer layer 110.

Hereinafter, the formation of the switching thin film transistor TRs, the capacitor C and the driving thin film transistor TRd will be described in detail.

Firstly, a semiconductor active layer SA may be formed on the buffer layer 110. The semiconductor active layer SA may include one of amorphous silicon (a-Si), poly silicon (p-Si), and oxide semiconductors. For example, the formation of the semiconductor active layer SA made of poly silicon may include depositing an amorphous silicon layer on the buffer layer 110, and crystallizing and patterning the amorphous silicon layer.

After the formation of the semiconductor active layer SA, a gate insulating layer 120 may be formed on the semiconductor active layer SA and the buffer layer 110. The gate insulating layer 120 may include at least one of silicon oxide or silicon nitride.

After the formation of the gate insulating layer 120, a gate electrode GE, a scan line SL, and a first capacitor electrode $C_1$ may be formed on the gate insulating layer 120. The gate electrode GE may be overlapped with the semiconductor active layer SA. In example embodiments, a region of the semiconductor active layer SA overlapped with the gate electrode GE may serve as a channel region, while other regions of the semiconductor active layer SA provided at respective sides of the channel region may serve as a source region and a drain region, respectively.

After the formation of the gate electrode GE, the scan line SL and the first capacitor electrode $C_1$, an interlayer insulating layer 130 may be formed. The interlayer insulating layer 130 may include silicon oxide or silicon nitride.

After the formation of the interlayer insulating layer 130, the interlayer insulating layer 130 may be patterned to expose the source region and the drain region. In example embodiments, the first capacitor electrode $C_1$ may be partially exposed during the patterning of the interlayer insulating layer 130.

Thereafter, a source electrode SE coupled to the source region, a drain electrode DE coupled to the drain region, a second capacitor electrode $C_2$ electrically separated (e.g., electrically isolated) from the first capacitor electrode $C_1$, a data line DL, and a power supply line VL may be formed to constitute the switching thin film transistor TRs, the capacitor C, and the driving thin film transistor TRd.

Each of the switching and driving thin film transistors TRs and TRd may include the semiconductor active layer SA, the gate electrode GE, the source electrode SE, and the drain electrode DE. The capacitor C may include the first capacitor electrode $C_1$ and the second capacitor electrode $C_2$. In example embodiments, the drain electrode DE of the switching thin film transistor TRs may be coupled to the first capacitor electrode $C_1$.

The source electrode SE, the drain electrode DE, the second capacitor electrode $C_2$, the data line DL, and the power supply line VL may include a reflective material. For example, the source electrode SE, the drain electrode DE, the second capacitor electrode $C_2$, the data line DL, and the power supply line VL may include at least one layer made of Al or Al-alloy.

In each of the pixels PX, the drain electrode DE of the driving thin film transistor TRd may be extended to a region, in which the switching thin film transistor TRs, the capacitor C, and the driving thin film transistor TRd are not provided.

Figure 5:
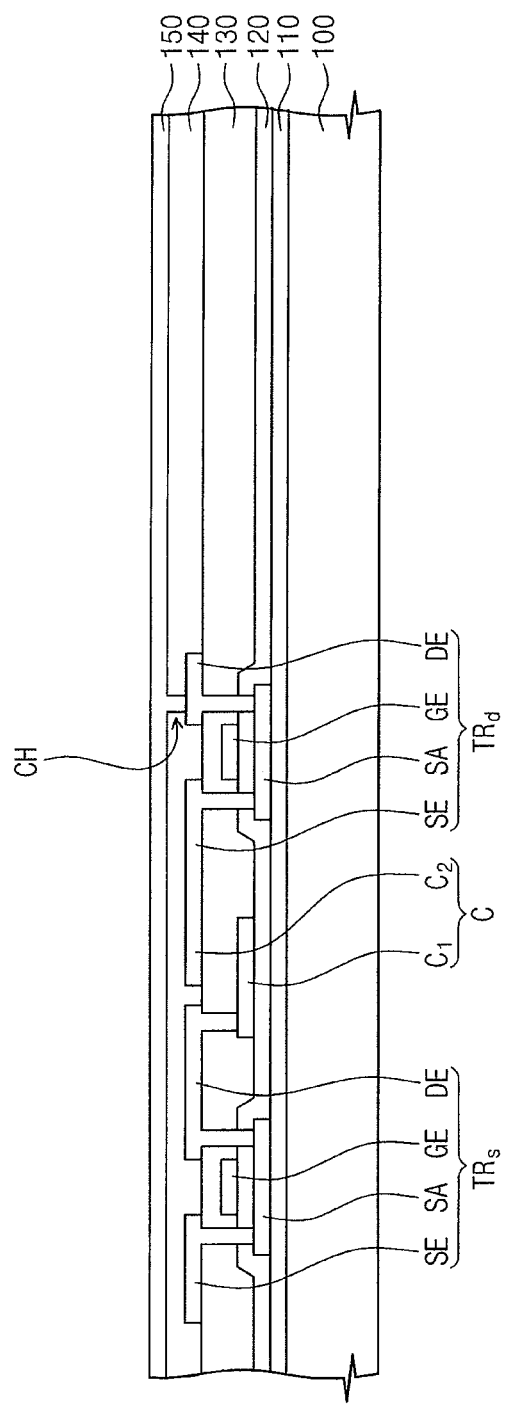

Referring to FIG. 5, a first protection layer 140 may be formed on the base substrate 100 provided with the switching thin film transistor TRs, the capacitor C, and the driving thin film transistor TRd. The first protection layer 140 may include at least one of silicon oxide or silicon nitride.

Thereafter, the first protection layer 140 may be patterned to form a contact hole CH partially exposing the drain electrode DE of the driving thin film transistor TRd.

After the formation of the contact hole CH, a conductive organic layer 150 may be formed on the first protection layer 140. The conductive organic layer 150 may be connected (e.g., electrically and/or physically coupled or connected) to the drain electrode DE of the driving thin film transistor TRd through the contact hole CH.

The conductive organic layer 150 may include a material, in which radical reaction can be initiated by heat, ultraviolet light, or radioactive ray provided from the outside. For example, the conductive organic layer 150 may include at least one of polyethylene-based polymer doped with conductive impurities, polypyrrole-based polymer doped with conductive impurities, or polythiophene-based polymer doped with conductive impurities, each of which contains one substituent of —COOH, —SH, —NH$_2$, —NH, or —N.

Figure 6:
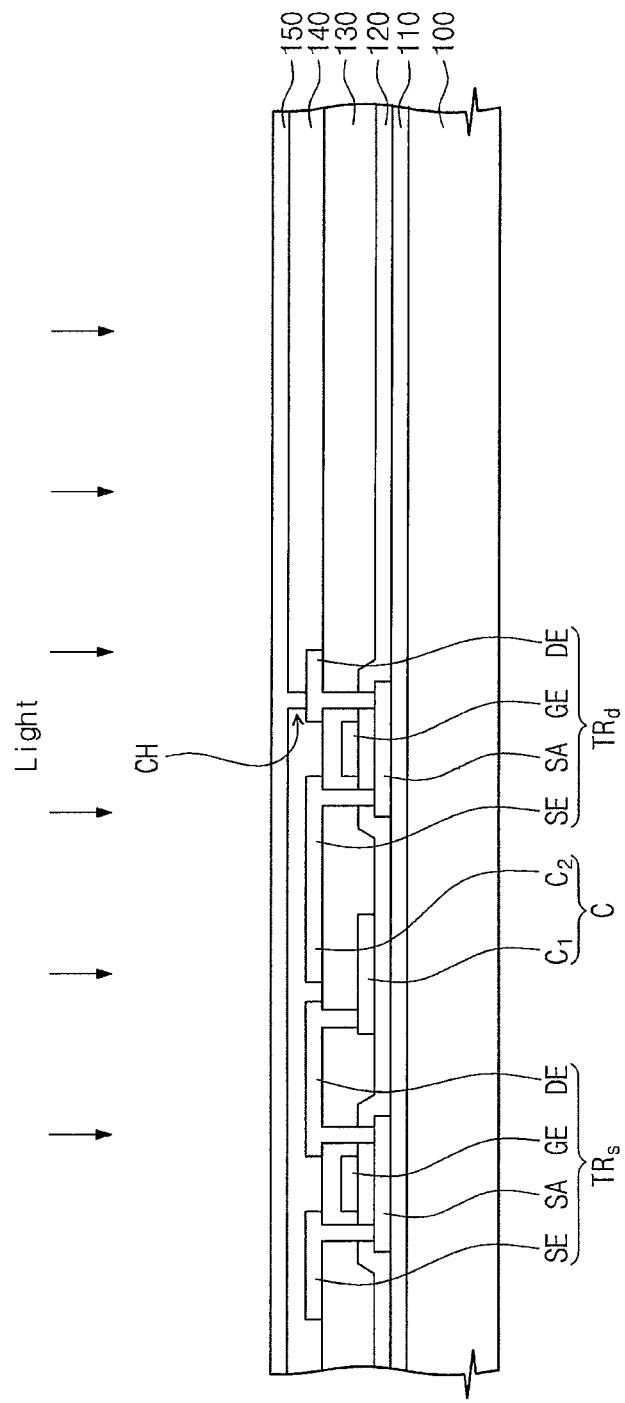

Referring to FIG. 6, after the formation of the conductive organic layer 150, light may be irradiated onto the conductive organic layer 150. The light may be one of infrared light, ultraviolet light, and radioactive ray.

If the conductive organic layer 150 is irradiated with the light, free radicals may be produced in the conductive organic layer 150 by the substituent and a chain radical reaction may occur by the free radicals. As the result of the radical reaction, the conductive organic layer 150 can be in contact with a conductive metal layer or a conductive oxide layer with an improved connection property. Accordingly, it is possible to improve electric contact characteristics between the conductive organic layer 150 and the drain electrode DE.

In example embodiments, during the irradiation of the light onto the conductive organic layer 150, at least one initiator of oxygen (O$_2$), ozone (O$_3$), nitrogen dioxide (NO$_2$), hydrogen peroxide (H$_2$O$_2$), ammonia (NH$_3$), or hydrazine (N$_2$H$_4$) may be supplied onto the conductive organic layer 150.

After the radical reaction, a second protection layer 160 may be formed on the conductive organic layer 150. The second protection layer 160 may include at least one layer. For example, the second protection layer 160 may include an inorganic protection layer and an organic protection layer disposed (e.g., located, arranged, or formed) on the inorganic protection layer. The inorganic protection layer may include at least one of silicon oxide or silicon nitride. In example embodiments, the organic protection layer may include at least one of acryl, polyimide (PI), polyamide (PA) or benzocyclobutene (BCB). In example embodiments, the organic protection layer may be transparent and flexible, and thus, it may serve as a planarization layer reducing unevenness of an underlying structure.

Figure 7:
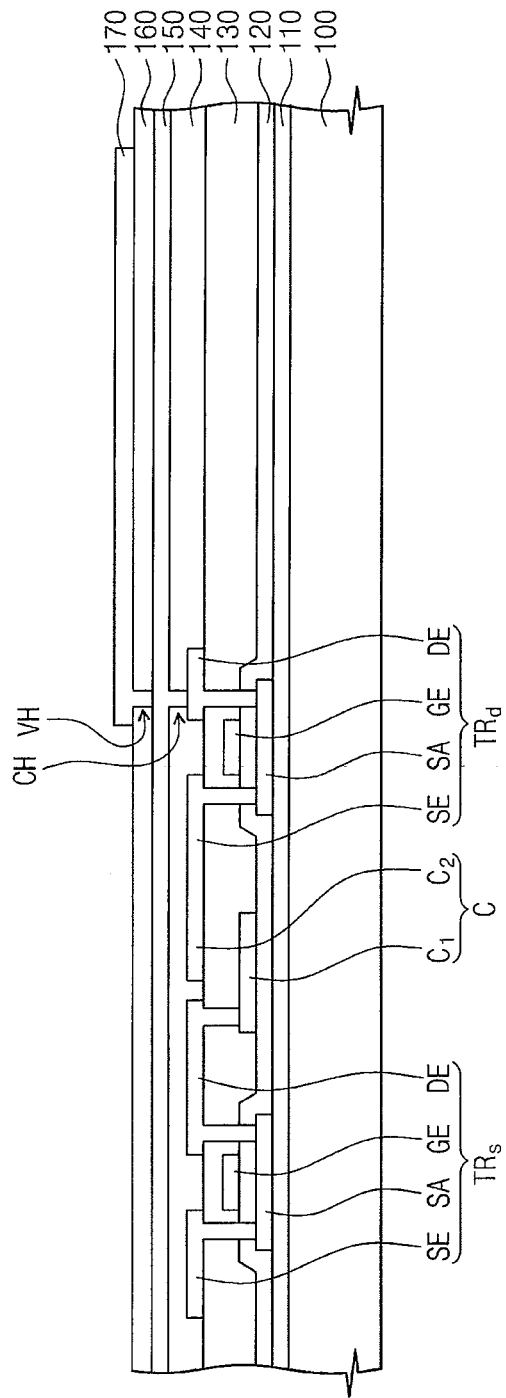

Referring to FIG. 7, after the formation of the second protection layer 160, the second protection layer 160 may be patterned to form a via hole VH exposing a portion of the conductive organic layer 150. In example embodiments, the via hole VH may be formed at a position overlapped with the contact hole CH.

After the formation of the via hole VH, a first electrode 170 may be formed on the second protection layer 160. In example embodiments, a portion of the first electrode 170 may be connected (e.g., electrically and/or physically coupled or connected) to the conductive organic layer 150 through the via hole VH.

The first electrode 170 may be a transparent conductive layer. For example, the first electrode 170 may include one of transparent conductive oxides, such as indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

Figure 8:
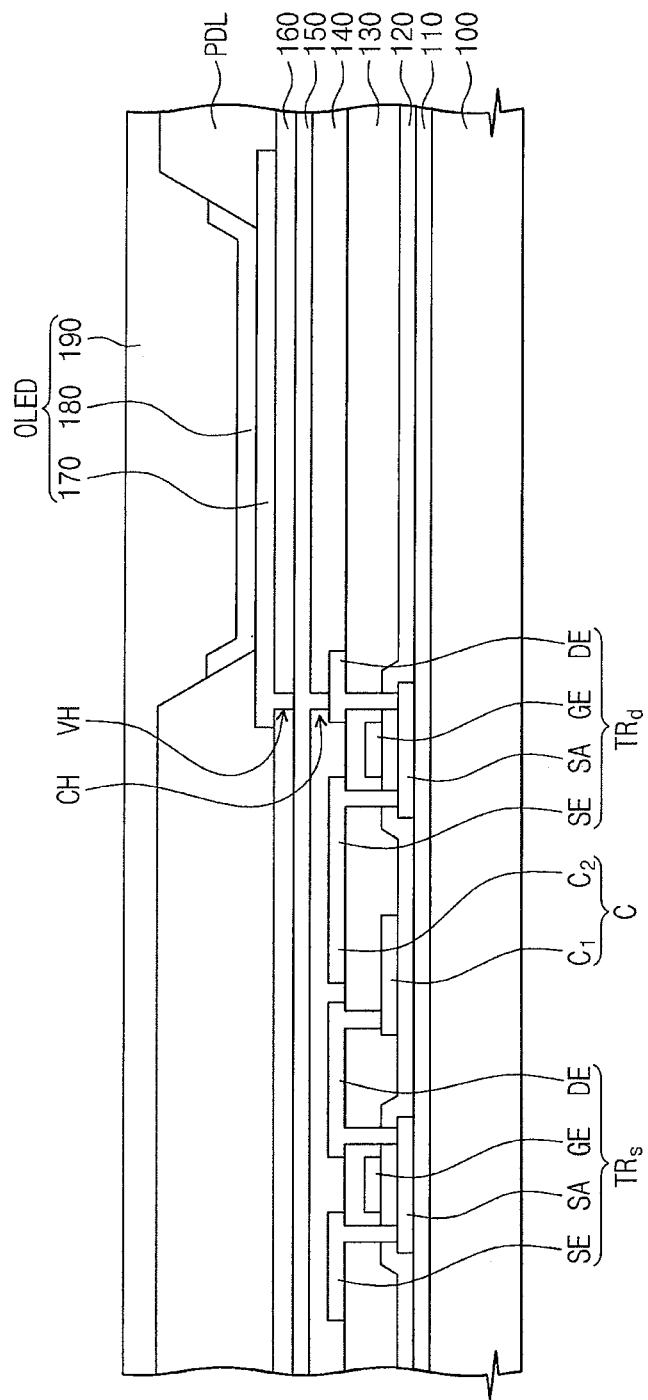

Referring to FIG. 8, after the formation of the first electrode 170, a pixel-defining layer PDL may be formed to expose at least a portion of the first electrode 170.

After the formation of the pixel-defining layer PDL, an organic layer 180 may be formed on the first electrode 170. The organic layer 180 may be formed using a deposition, transfer or printing process.

The organic layer 180 may have a multi-layered structure including at least one emitting layer EML. For example, the organic layer 180 may include a hole injection layer HIL, a hole transport layer HTL, the emitting layer EML, a hole blocking layer HBL, an electron transport layer ETL, and/or an electron injection layer EIL. The hole transport layer HTL may have high hole mobility and be configured to suppress movement of electrons that are not combined in the emitting layer EML, thereby increasing probability of recombination between holes and electrons in the emitting layer EML. In the emitting layer EML, the injected electrons and holes may be combined with each other to emit light. The hole blocking layer HBL may be configured to suppress holes, which are not combined with electrons in the emitting layer EML, from moving. The electron transport layer ETL may be configured to move electrons to the emitting layer EML efficiently.

After the formation of the organic layer 180, a second electrode 190 may be formed on the organic layer 180 to complete a process of fabricating an organic light emitting device OLED. In example embodiments, the second electrode 190 may include at least one of low work-function metals, such as, Mo, W, Ag, Mg, Al, Pt, Pd, Au, Ni, Nd, Ir, Cr, Li, Ca, or alloys thereof.

After the formation of the second electrode 190, an encapsulating process may be performed to form an organic light emitting display device. For example, an encapsulating substrate (not shown) including a transparent insulating material may be provided on the second electrode 190, and then, the encapsulating substrate may be bonded to the base substrate 100 provided with organic light emitting device OLED, thereby finishing the fabrication of the organic light emitting display device.

Further, a transparent insulating layer (not shown) may be formed on the second electrode 190 to isolate the organic light emitting device OLED from the outside environment.

Hereinafter, other example embodiments of the present inventive concepts will be described with reference to FIGS. 9 through 14. In the following description, for concise description, a previously described element may be identified by a similar or identical reference number without repeating an overlapping (or redundant) description thereof.

Figure 9:
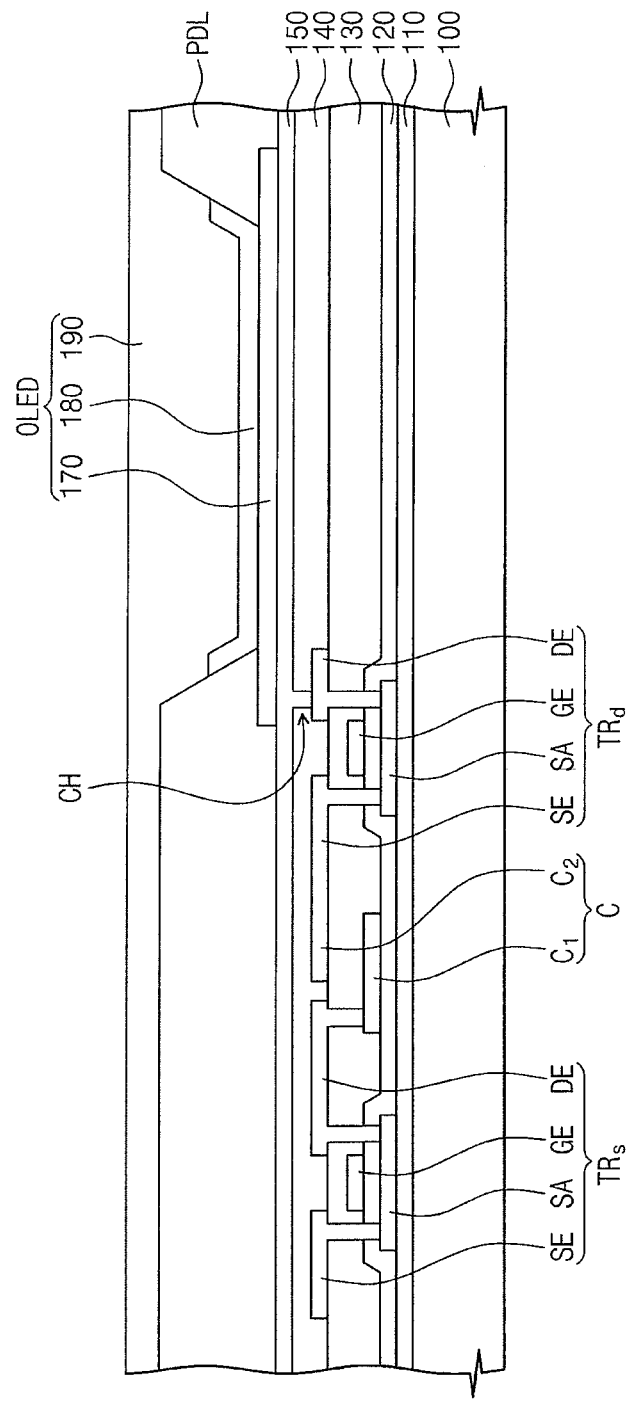
FIG. 9 is a sectional view of an organic light emitting display device according to other example embodiments of the present inventive concepts.

FIG. 9 is a sectional view of an organic light emitting display device according to other example embodiments of the present inventive concepts.

Referring to FIG. 9, each of pixels of an organic light emitting display device may include a switching thin film transistor TRs, a driving thin film transistor TRd, a capacitor C electrically coupled to the switching and driving thin film transistors TRs and TRd, and the organic light emitting device OLED that are disposed (e.g., located, arranged, or formed) on a base substrate 100.

The switching thin film transistor TRs and the driving thin film transistor TRd may include the semiconductor active layer SA provided on an optically transparent base substrate 100 (e.g., made of glass or transparent plastic material), the gate electrode GE electrically separated (e.g., electrically isolated) from the semiconductor active layer SA, and the source electrode SE and the drain electrode DE that are connected (e.g., electrically and/or physically coupled or connected) to the semiconductor active layer SA.

The capacitor C may include the first capacitor electrode $C_1$ and the second capacitor electrode $C_2$.

A first protection layer 140 may be disposed (e.g., located, arranged, or formed) on the base substrate 100 provided with the switching thin film transistor TRs, the driving thin film transistor TRd, and the capacitor C. In example embodiments, the first protection layer 140 may cover the switching thin film transistor TRs, the driving thin film transistor TRd and the capacitor C. In addition, the first protection layer 140 may have a contact hole CH exposing a portion of the drain electrode DE.

A conductive organic layer 150 may be provided on the first protection layer 140 and be connected (e.g., physically and/or electrically coupled or connected) to the drain electrode DE through the contact hole CH. Further, the conductive organic layer 150 may be optically transparent. The conductive organic layer 150 may include at least one of polyethylene-based polymer doped with conductive impurities, polypyrrole-based polymer doped with conductive impurities, or polythiophene-based polymer doped with conductive impurities, each of which contains one substituent of —COOH, —SH, —NH$_2$, —NH, or —N.

An organic light emitting device OLED may be provided on the conductive organic layer 150. The organic light emitting device OLED may include a first electrode 170 disposed (e.g., located, arranged, or formed) on the conductive organic layer 150, a pixel-defining layer PDL exposing a portion of the first electrode 170, an organic layer 180 disposed (e.g., located, arranged, or formed) on the first electrode 170, and a second electrode 190 disposed (e.g., located, arranged, or formed) on the organic layer 180.

Hereinafter, a method of fabricating the organic light emitting display device will be described with reference to FIGS. 10 through 13.

FIGS. 10 through 13 are sectional views illustrating a method of fabricating an organic light emitting display device of FIG. 9.

Figure 10:
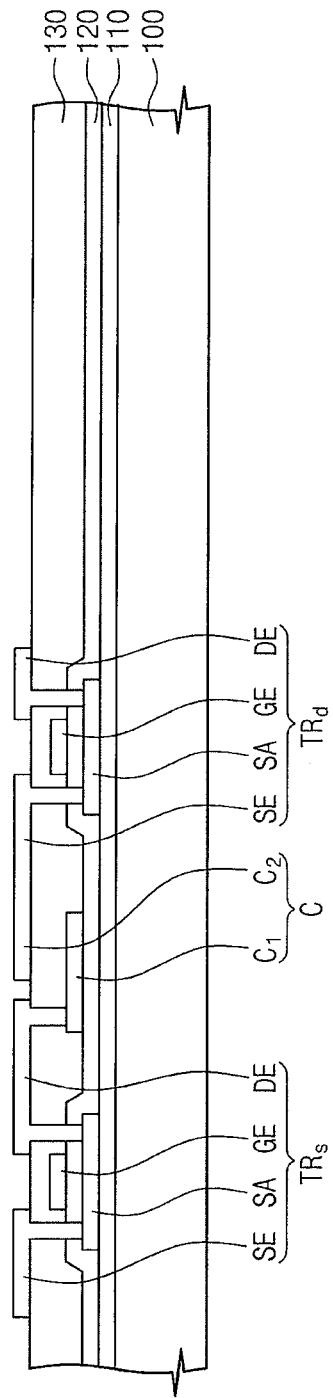
FIGS. 10 through 13 are sectional views illustrating a method of fabricating an organic light emitting display device of FIG. 9.

Referring to FIG. 10, a buffer layer 110 may be formed on a base substrate 100, and a switching thin film transistor TRs, a driving thin film transistor TRd, and a capacitor C may be formed on the buffer layer 110.

the switching and driving thin film transistors TRs and TRd may include a semiconductor active layer SA, a gate electrode GE electrically separated (e.g., electrically isolated) from the semiconductor active layer SA, and a source electrode SE and a drain electrode DE coupled (e.g., electrically and/or physically coupled or connected) to the semiconductor active layer SA. The capacitor C may include a first capacitor electrode C1 and a second capacitor electrode C2.

Figure 11:
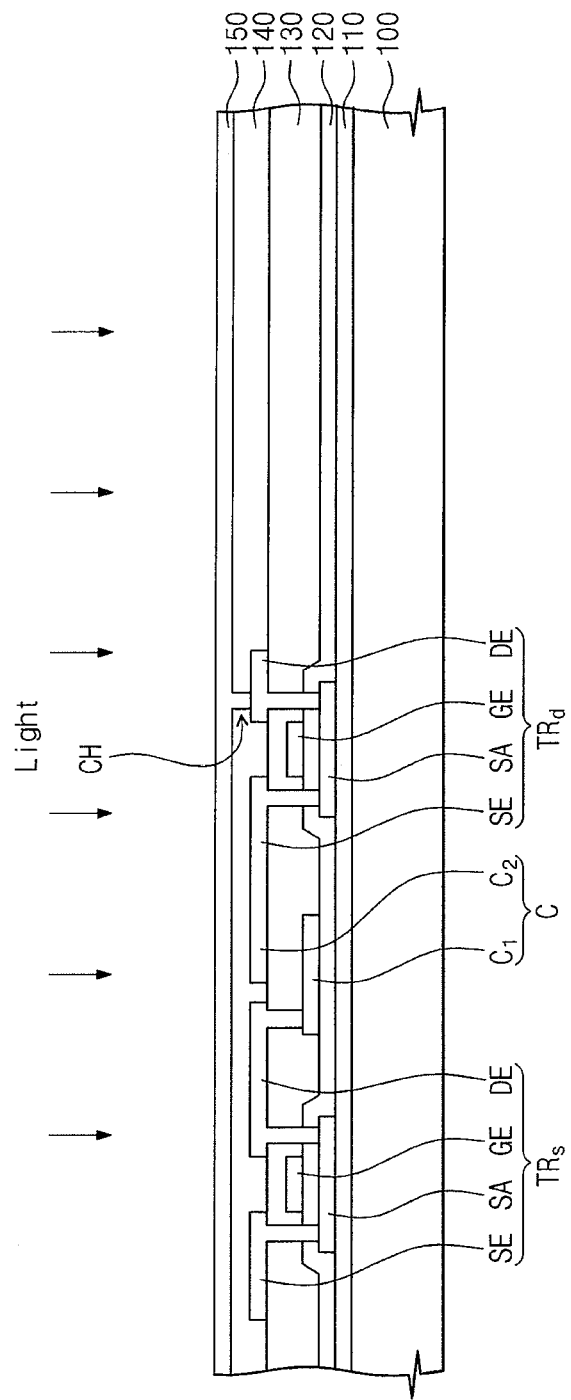

Referring to FIG. 11, after the formation of the switching thin film transistor TRs, the driving thin film transistor TRd, and the capacitor C, a protection layer 140 may be formed to cover the switching thin film transistor TRs, the driving thin film transistor TRd, and the capacitor C.

After the formation of the protection layer 140, the protection layer 140 may be patterned to form a contact hole CH exposing the drain electrode DE of the driving thin film transistor TRd.

After the formation of the contact hole CH, a conductive organic layer 150 may be formed on the protection layer 140. The conductive organic layer 150 may include at least one of polyethylene-based polymer doped with conductive impurities, polypyrrole-based polymer doped with conductive impurities, or polythiophene-based polymer doped with conductive impurities, each of which contains one substituent of —COOH, —SH, —NH$_2$, —NH, or —N.

After the formation of the conductive organic layer 150, light may be illuminated to the conductive organic layer 150. In example embodiments, the light may be one of infrared light, ultraviolet light, and radioactive ray.

If the conductive organic layer 150 is irradiated with the light, free radicals may be produced in the conductive organic layer 150 by the substituent, and consequently, a chain radical reaction may be caused by the free radicals. As the result of the radical reaction, it is possible to improve electric contact characteristics between the conductive organic layer 150 and the drain electrode DE.

In example embodiments, during the irradiation of the light onto the conductive organic layer 150, at least one initiator of oxygen ($O_2$), ozone ($O_3$), nitrogen dioxide ($NO_2$), hydrogen peroxide ($H_2O_2$), ammonia ($NH_3$), or hydrazine ($N_2H_4$) may be supplied onto the conductive organic layer 150.

After the radical reaction, an organic light emitting device OLED may be formed on the conductive organic layer 150.

Figure 12:
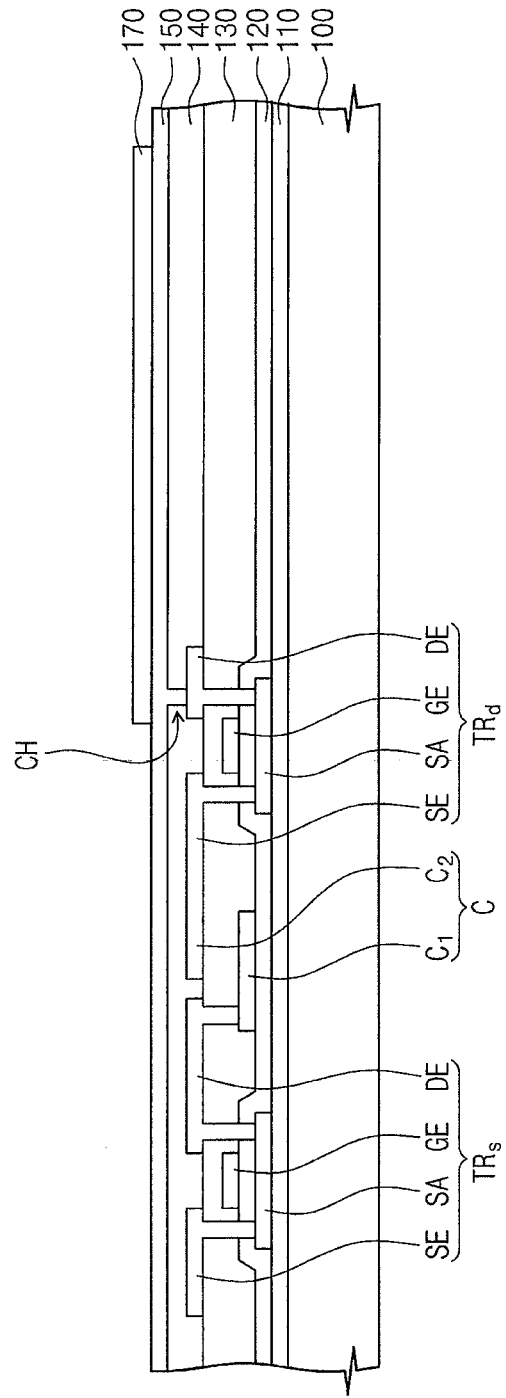

For example, as shown in FIG. 12, a first electrode 170 may be formed on the conductive organic layer 150. The first electrode 170 may include one of indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

Figure 13:
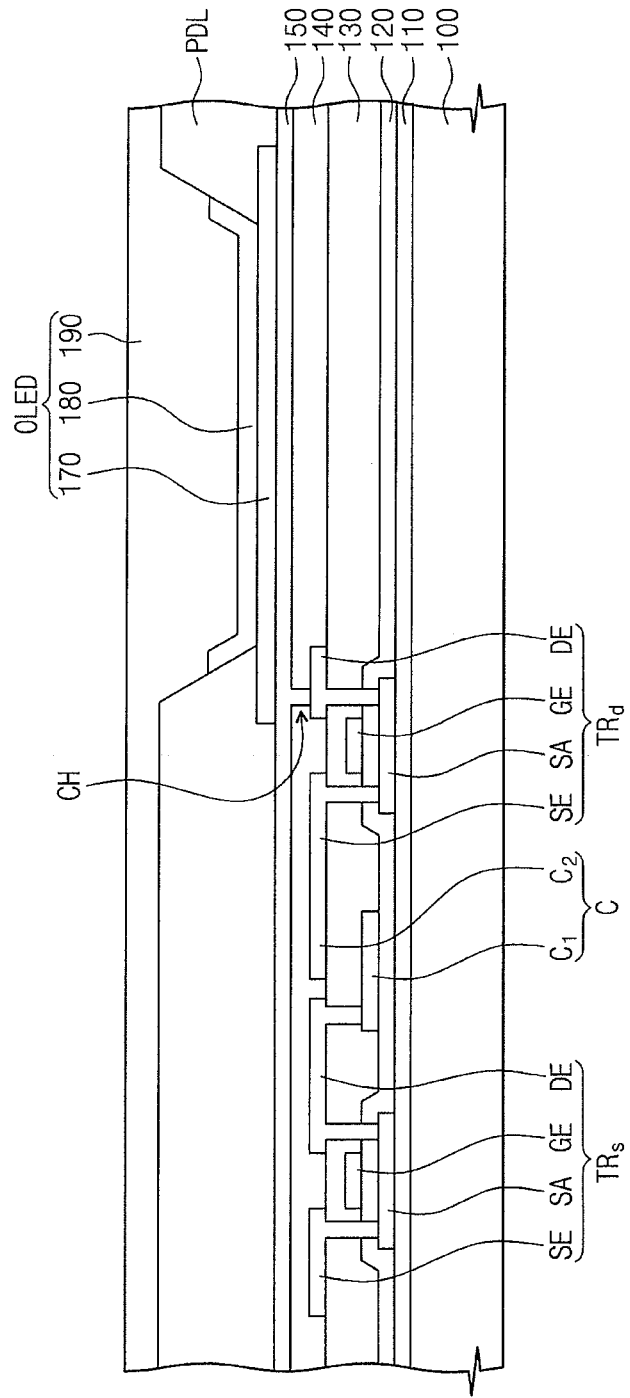

Thereafter, as shown in FIG. 13, a pixel-defining layer PDL may be formed to expose at least a portion of the first electrode 170.

After the formation of the pixel-defining layer PDL, an organic layer 180 may be formed on the first electrode 170. The organic layer 180 may be formed using a deposition, transfer or printing process.

After the formation of the organic layer 180, a second electrode 190 may be formed on the organic layer 180 to complete a process of fabricating an organic light emitting device OLED.

Figure 14:
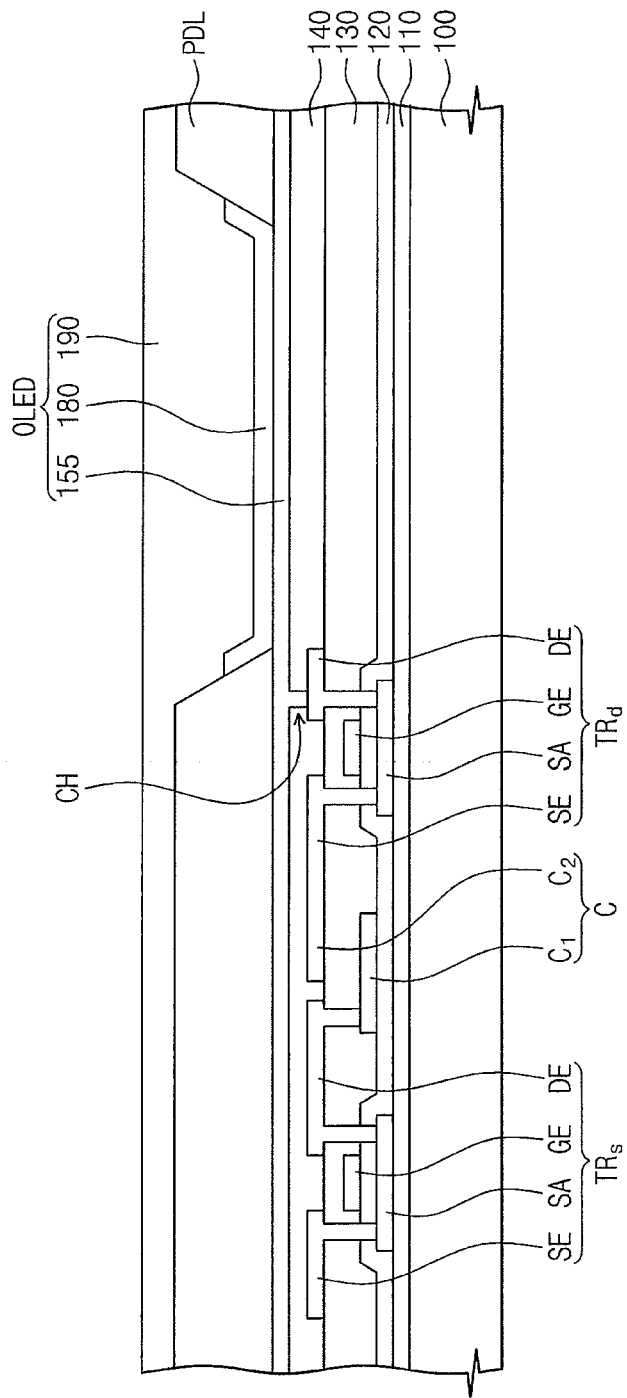
FIG. 14 is a sectional view of an organic light emitting display device according to still other example embodiments of the present inventive concepts.

FIG. 14 is a sectional view of an organic light emitting display device according to still other example embodiments of the present inventive concepts.

Referring to FIG. 14, each of pixels of an organic light emitting display device may include a switching thin film transistor TRs, a driving thin film transistor TRd, a capacitor C electrically coupled to the switching and driving thin film transistors TRs and TRd, and the organic light emitting device OLED that are disposed (e.g., located, arranged, or formed) on a base substrate 100.

The switching and driving thin film transistors TRs and TRd may include the semiconductor active layer SA provided on an optically transparent base substrate 100 (e.g., made of glass or transparent plastic material), the gate electrode GE electrically separated (e.g., electrically isolated) from the semiconductor active layer SA, and the source electrode SE and the drain electrode DE that are connected (e.g., electrically and/or physically coupled or connected) to the semiconductor active layer SA.

The capacitor C may be formed a first capacitor electrode C1 and a second capacitor electrode C2.

A protection layer 140 may be provided on the base substrate 100 disposed (e.g., located, arranged, or formed) on the switching thin film transistor TRs, the driving thin film transistor TRd, and the capacitor C. In example embodiments, the protection layer 140 may be formed to cover the switching thin film transistor TRs, the driving thin film transistor TRd, and the capacitor C. Further, the protection layer 140 may be formed to have a contact hole CH exposing a portion of the drain electrode DE of the driving thin-film transistor TRd.

An organic light emitting device OLED may be provided on the protection layer 140 and be connected (e.g., electrically and/or physically coupled or connected) to the drain electrode DE through the contact hole CH.

The organic light emitting device OLED may include a conductive organic layer 155 connected (e.g., electrically and/or physically coupled or connected) to the drain electrode DE of the driving thin film transistor TRd through the contact hole CH, a pixel-defining layer PDL exposing a portion of the conductive organic layer 155, an organic layer 180 disposed (e.g., located, arranged or formed) on the conductive organic layer 155, and a second electrode 190 disposed (e.g., located, arranged or formed) on the organic layer 180.

In other words, the conductive organic layer 155 may serve as an electrode of the organic light emitting device OLED. The conductive organic layer 155 may include a transmissive conductive organic material.

The conductive organic layer 155 may include at least one of polyethylene-based polymer doped with conductive impurities, polypyrrole-based polymer doped with conductive impurities, or polythiophene-based polymer doped with conductive impurities, each of which contains one substituent of —COOH, —SH, —NH$_2$, —NH, or —N.

According to example embodiments of the present inventive concepts, an organic light emitting display device may include a conductive organic layer that connects (e.g., electrically and/or physically couples or connects) a drain electrode of a thin film transistor electrically to a first electrode of an organic light emitting device. The conductive organic layer may have a surface property capable of improving electric connection characteristics with the drain electrode and the first electrode. Accordingly, an organic light emitting display device provided with the conductive organic layer can have improved electric connection characteristics between interconnection lines.

While example embodiments of the inventive concepts have been particularly shown and described, it will be understood by one of ordinary skill in the art that variations in form and detail may be made therein without departing from the spirit and scope of the attached claims, and equivalents thereof.

What is claimed is:

1. An organic light emitting display device comprising:
    a thin film transistor on a substrate;
    a first protection layer covering the thin film transistor;
    a conductive organic layer on the first protection layer and coupled to the thin film transistor;
    an organic light emitting device on the conductive organic layer and coupled to the conductive organic layer, the organic light emitting device comprising a first electrode coupled to the conductive organic layer; and
    a second protection layer between the conductive organic layer and the first electrode of the organic light emitting device,
    wherein the conductive organic layer overlaps a source electrode and a drain electrode of the thin film transistor in a direction perpendicular to a plane of the substrate, and
    wherein the first electrode is coupled to the conductive organic layer through the second protection layer.

2. The display device of claim 1, wherein the conductive organic layer comprises at least one of polyethylene-based polymer doped with conductive impurities, polypyrrole-based polymer doped with conductive impurities, or polythiophene-based polymer doped with conductive impurities, each of which contains one substituent of —COOH, —SH, —NH$_2$, —NH, or —N.

3. The display device of claim 2, wherein the organic light emitting device further comprises:
    an organic layer on the first electrode and comprising at least an emitting layer; and
    a second electrode on the organic layer.

4. The display device of claim 3,
    wherein the second protection layer has a via hole exposing a portion of the conductive organic layer, arid
    wherein the first electrode is coupled to the conductive organic layer through the via hole.

5. The display device of claim 4, wherein the second protection layer comprises:
    an inorganic protection layer on the conductive organic layer; and
    an organic protection layer on the inorganic protection layer.

6. The display device of claim 1, wherein the first protection layer comprises at least one of silicon oxide or silicon nitride.

7. An organic light emitting display device comprising:
    a thin film transistor on a substrate;
    a protection layer covering the thin film transistor;
    a conductive organic layer on the protection layer and coupled to the thin film transistor;
    an organic light emitting device on the conductive organic layer and coupled to the thin film transistor, wherein the organic light emitting device comprises:
        a first electrode on the conductive organic layer;
        an organic layer on the first electrode; and
        a second electrode on the organic layer, and
    wherein the conductive organic layer overlaps a source electrode and a drain electrode of the thin film transistor in a direction perpendicular to a plane of the substrate, and
    wherein an entire bottom surface of the first electrode contacts the conductive organic laver.

8. The display device of claim 7, wherein the first electrode may include at least one of polyethylene-based polymer doped with conductive impurities, polypyrrole-based polymer doped with conductive impurities, or polythiophene-based polymer doped with conductive impurities, each of which contains one substituent of —COOH, —SH,—NH$_2$, —NH, or —N.

9. The display device of claim 7, wherein the protection layer comprises at least one of silicon oxide or silicon nitride.

10. A method of fabricating an organic light emitting display device, the method comprising:
    forming a thin film transistor on a substrate;
    forming a first protection layer covering the thin film transistor, the first protection layer having a contact hole exposing a portion of a drain electrode of the thin film transistor;
    forming a conductive organic layer on the first protection layer, the conductive organic layer being coupled to the drain electrode;
    forming an organic light emitting device coupled to the conductive organic layer, wherein the forming of the organic light emitting device comprises:
        forming a first electrode coupled to the conductive organic layer; and
        forming a second protection layer between the conductive organic layer and the first electrode of the organic light emitting device, wherein the conductive organic layer overlaps a source electrode and the drain electrode of the thin film transistor in a direction perpendicular to a plane of the substrate, and wherein the first electrode is coupled to the conductive organic layer through a second electrode.

11. The method of claim 10, wherein the conductive organic layer comprises at least one of polyethylene-based polymer doped with conductive impurities, polypyrrole-based polymer doped with conductive impurities, or polythiophene-based polymer doped with conductive impurities, each of which contains one substituent of —COOH, —SH, —$NH_2$, —NH, or —.

12. The method of claim 11, further comprising irradiating the conductive organic layer with light, wherein a radical reaction occurs in the conductive organic layer when the conductive organic layer is irradiated with the light.

13. The method of claim 12, further comprising supplying at least one initiator of oxygen ($O_2$), ozone ($O_3$), nitrogen dioxide ($NO_2$), hydrogen peroxide ($H_2O_2$), ammonia ($NH_3$), or hydrazine ($N_2H_4$) onto the conductive organic layer while the conductive organic layer is being irradiated.

14. The method of claim 11, wherein the forming of the organic light emitting device further comprises:

forming an organic layer on the first electrode, the organic layer comprising at least an emitting layer; and forming the second electrode on the organic layer.

15. The method of claim 14, further comprising:

patterning the second protection layer to form a via hole exposing a portion of the conductive organic layer.

16. The method of claim 15, wherein the forming of the second protection layer comprises:

forming an inorganic protection layer on the conductive organic layer; and forming an organic protection layer on the inorganic protection layer.

17. The method of claim 10, wherein the protection layer comprises at least one of silicon oxide or silicon nitride.

* * * * *